(12) United States Patent
Gagne et al.

(10) Patent No.: US 9,391,063 B2
(45) Date of Patent: Jul. 12, 2016

(54) UNDER VOLTAGE TOLERANT CLAMP

(75) Inventors: Nickole Gagne, Saco, ME (US);
Gregory A. Maher, Cape Elizabeth, ME (US); Christian Klein, Portland, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 1450 days.

(21) Appl. No.: 13/114,738

(22) Filed: May 24, 2011

(65) Prior Publication Data

US 2012/0299546 A1 Nov. 29, 2012

(51) Int. Cl.
*H02J 7/00* (2006.01)
*H01L 27/02* (2006.01)
*H01L 27/06* (2006.01)

(52) U.S. Cl.
CPC ........ *H01L 27/0266* (2013.01); *H01L 27/0629* (2013.01)

(58) Field of Classification Search
CPC ....................................................... Y02E 60/12
USPC ........................................................... 320/114
See application file for complete search history.

(56) References Cited

U.S. PATENT DOCUMENTS

| 5,530,640 | A | * | 6/1996 | Hara et al. ...................... 363/60 |
| 5,568,083 | A | * | 10/1996 | Uchiyama et al. ............ 327/538 |
| 2010/0002480 | A1 | * | 1/2010 | Huynh et al. ................... 363/90 |
| 2010/0253410 | A1 | | 10/2010 | Tan et al. | |

FOREIGN PATENT DOCUMENTS

| CN | 1229252 A | 9/1999 |
| CN | 1428857 A | 7/2003 |
| CN | 101093984 A | 12/2007 |
| CN | 101379685 A | 3/2009 |
| CN | 101488714 A | 7/2009 |
| CN | 101682322 A | 3/2010 |
| CN | 102800666 A | 11/2012 |
| CN | 202977418 U | 6/2013 |
| JP | 2001085618 A | 3/2001 |

OTHER PUBLICATIONS

"Chinese Application Serial No. 201210164561.6, Office Action mailed Jul. 29, 2014", 7 pgs.
"Chinese Application Serial No. 201220237690.9, Notification to make Rectification mailed Dec. 31, 2012", 2 pgs.

(Continued)

*Primary Examiner* — Yalkew Fantu
(74) *Attorney, Agent, or Firm* — Schwegman Lundberg & Woessner, P.A.

(57) ABSTRACT

An apparatus comprises an integrated circuit (IC) comprising an external IC connection, an IC substrate connection, a voltage clamp circuit and an under voltage circuit. The voltage of the IC substrate connection is set to a first voltage when a voltage of the external connection of the IC is within a normal operating voltage range. The voltage clamp circuit is configured to clamp the voltage supply of one or more circuits internal to the IC to within a normal operating voltage range when the voltage of the external IC connection exceeds the normal operating voltage range. The under voltage circuit is communicatively coupled to the clamp circuit and configured to set the voltage of the substrate to a second voltage when the voltage at the external IC connection of the IC is less than zero volts.

20 Claims, 5 Drawing Sheets

(56) References Cited

OTHER PUBLICATIONS

"Chinese Application Serial No. 201220237690.9, Response filed Jan. 4, 2013 to Office Action mailed Dec. 31, 2012", 20 pgs.

"Chinese Application Serial No. 201220237690.9, Office Action mailed Oct. 17, 2012", 3 pgs.

"Chinese Application Serial No. 201220237690.9, Response filed Nov. 7, 2012 to Office Action mailed Oct. 17, 2012", 40 pgs.

* cited by examiner

UNDER VOLTAGE TOLERANT CLAMP

BACKGROUND

An integrated circuit (IC) can receive electrical signals from off chip electronics. Protection from excessive voltage is a concern for ICs. Typically, excessive voltage can occur due to electrostatic discharge (ESD), but excessive voltage can also occur due to inadvertent exposure of the IC to excessive supply voltages. This can result in degradation of structures within an IC.

OVERVIEW

This document relates generally to electronic systems and devices and more specifically to improving the robustness of electronic devices with integrated circuits when exposed to adverse biasing conditions.

An apparatus example includes an IC comprising an external IC connection, an IC substrate connection, a voltage clamp circuit, and an under voltage circuit. The voltage of the IC substrate connection is set to a first voltage when a voltage of the external connection of the IC is within a normal operating voltage range. The voltage clamp circuit is configured to clamp the voltage supply of one or more circuits internal to the IC to within a normal operating voltage range when the voltage of the external IC connection exceeds the normal operating voltage range. The under voltage circuit is communicatively coupled to the clamp circuit and configured to set the voltage of the IC substrate to a second voltage when the voltage at the external IC connection of the IC is less than zero volts.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Integrated circuits can be inadvertently exposed to excessive voltages. For example, automobiles can include chargers for electronic devices such as cellular telephones. A failure in electronic circuits of the charging system could result in the electronic devices being exposed to voltages as high as twenty eight volts (28V) for example. In another example, if a plug from wall-outlet charging system is inadvertently connected backwards, the electronics could be exposed to a negative voltage of two to four volts (−2V to −4V). To protect ICs, circuits can be included to prevent low voltage circuits from being exposed to excessive voltages.

Electronic circuits typically operate in a voltage range of 0V to 2V, or 0V to 4V. In an over voltage situation, a clamp circuit can be used to maintain the voltage supply of the IC to a maximum voltage, such as 4V or 6V for example. In an under voltage situation, the voltage supply goes below ground (0V), or goes negative. When this happens, parasitic diodes in the IC can become forward biased and generate a large amount of current. This current can degrade the lifetime of junctions in the IC. To protect the IC in during an under voltage event, a negative internal power rail can be produced. The negative internal power rail is applied to device isolation taps and/or substrate taps of IC devices to limit the current passed by the forward biased diodes.

Figure 1:
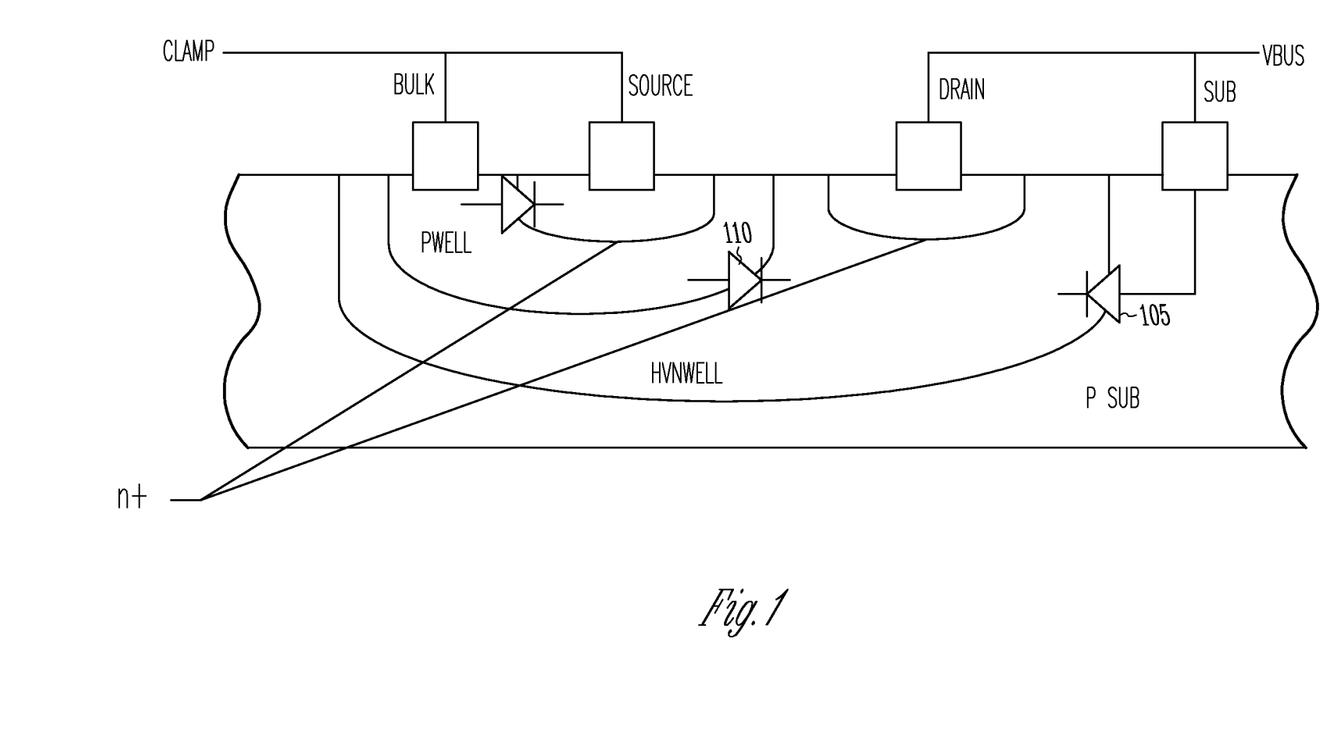
FIG. 1 is a representation of a cross section of a high voltage NMOS transistor.

FIG. 1 is a representation of a cross section of high voltage NMOS transistor. The high voltage device can be used in a high voltage clamp circuit. The VBUS connection represents the voltage supply connection and Clamp represents the connection providing the clamped voltage to the rest of the circuit or IC. When VBUS goes below ground, the Drain of the transistor and the High Voltage N-Well (HVNWell) go below ground. The substrate (Sub) is typically tied to ground, so the parasitic diode 105 between substrate and n-well becomes forward biased. The parasitic diode between the HVNWell and the Bulk/Source junction of the transistor drives Clamp to a voltage of $-VBUS+V_T$, where $V_T$ is a threshold voltage of the parasitic diode.

Limiting the current passed by the forward biased diodes preserves the internal IC devices during an under voltage event, and results in a circuit that is tolerant to negative voltages on the power supply. To limit the current, the substrate is driven below ground to keep parasitic diode 105 reverse biased. This limits the current consumed by the parasitic diode 105.

Figure 2:
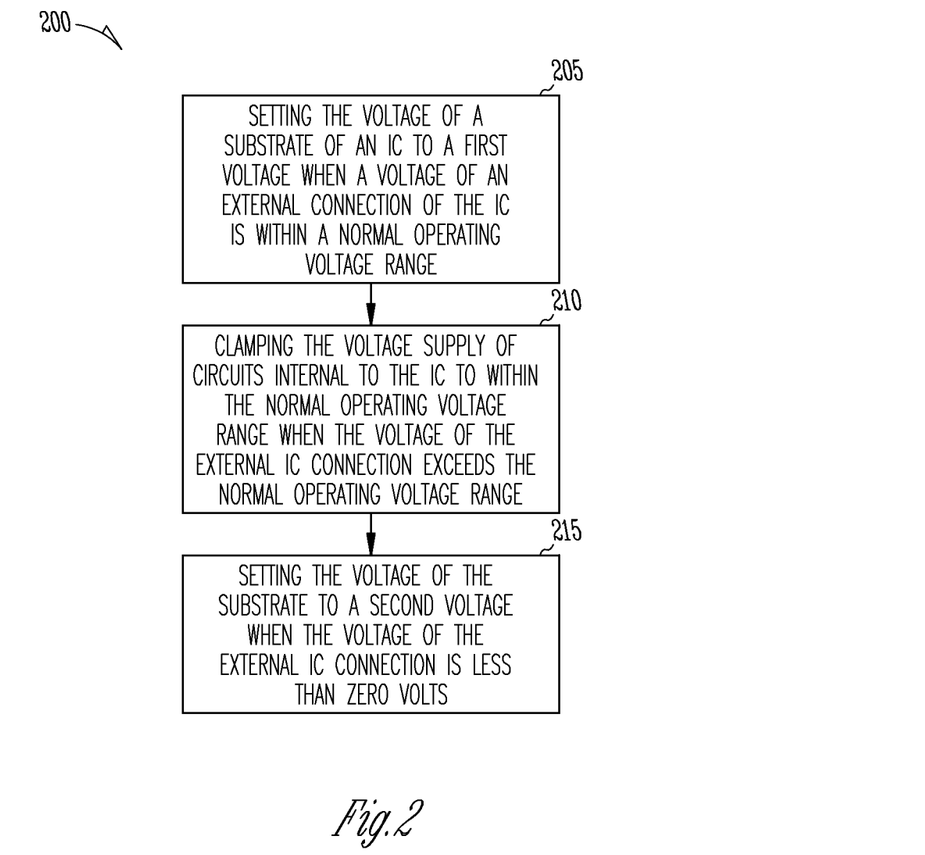
FIG. 2 shows a flow diagram of an example of a method of protecting an IC from over voltage events and under voltage events.

FIG. 2 shows a flow diagram of an example of a method of protecting an IC from over voltage events and under voltage events. At block 205, the voltage of a substrate of an IC is set to a first voltage when a voltage of an external connection of the IC is within a normal operating voltage range. In some examples, the first voltage is zero volts or ground. Examples of a normal operating voltage range include 0V to 2V or 0V to 4V.

At block 210, the voltage supply of circuits internal to the IC is clamped to within the normal operating voltage range when the voltage of the external IC connection exceeds the normal operating voltage range. For example, a voltage at an external IC connection of 6V can be clamped to about 4V and an external IC connection of 28V can be clamped to about 6V.

At block 215, the voltage of the substrate is set to a second voltage when the voltage of the external IC connection is less than zero volts (e.g., from −2.0V to −4.0V). In some examples, the second voltage is substantially the voltage of the external IC connection that is below ground. In some examples, the second voltage differs from the voltage of the external IC connection by a voltage drop across one or more devices in the IC.

The method 200 can also be used to limit current in parasitic devices associated with isolated devices. Rather than biasing a substrate connection, an isolation layer is set to the second voltage to reduce current during an undervoltage event.

Figure 3:
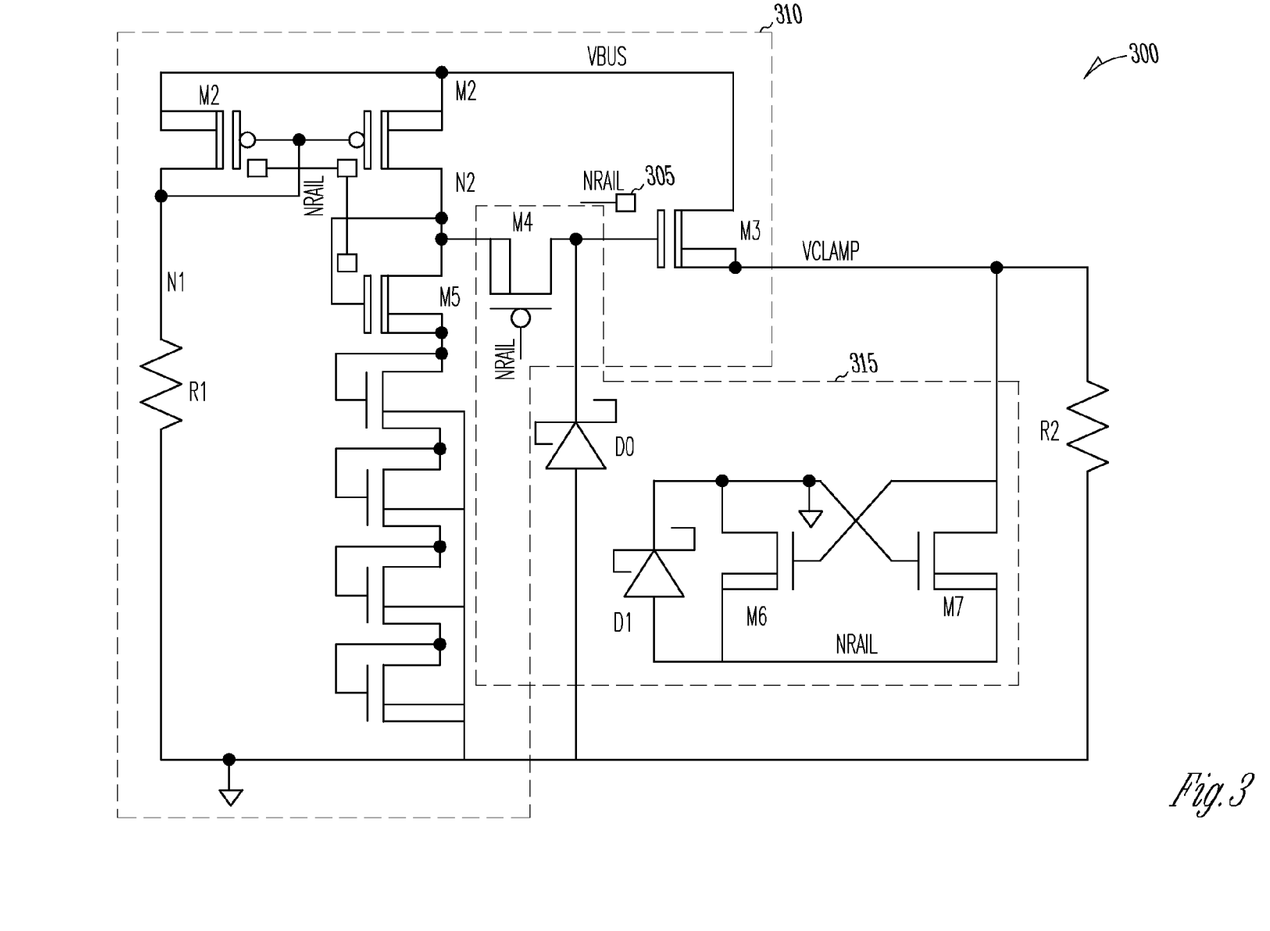
FIG. 3 shows a schematic of an example of an under voltage tolerant clamp circuit.

FIG. 3 shows a schematic of an example of an under voltage tolerant clamp circuit 300. The circuit 300 includes an external IC connection (VBUS) and an IC substrate connection 305. The voltage of the IC substrate connection 305 is set to a first voltage when a voltage of the external connection of the IC is within a normal operating voltage range. In some examples, the IC substrate connection 305 is set to ground by transistor M6 when VBUS is within normal operating conditions.

The under voltage tolerant clamp circuit 300 includes a voltage clamp circuit 310 that clamps the voltage supply of one or more circuits internal to the IC to within a normal operating voltage range when the voltage of the external IC connection exceeds the normal operating voltage range. This is done to protect low voltage devices within the IC.

Transistors M1 and M2 are high voltage P-Type Metal Oxide Semiconductor (PMOS) devices, and M5 and M3 are high voltage N-type Metal Oxide Semiconductor (NMOS) devices. Transistor M3 corresponds to the transistor of FIG. 1. Transistors M1 and M2 form a current mirror. The diode stack, that includes M5 and the four diode-connected transistors below it, maintains the gate voltage of M3 to about five diode voltage drops (e.g., about 5*0.7V, depending on the current in the stack). Transistor M3 is connected as a source follower and limits VCLAMP to substantially the voltage of the diode stack minus a threshold voltage ($V_T$) of transistor M3.

The under voltage tolerant clamp circuit 300 also includes an under voltage circuit 315 communicatively coupled to the voltage clamp circuit 310 and configured to set the voltage of the substrate to a second voltage when the voltage at the external IC connection of the IC is less than zero volts. In some examples, the under voltage circuit sets the voltage of the substrate to substantially the voltage at the external IC connection when the voltage at the external IC connection (VBUS) is less than zero volts. In some examples, the under voltage circuit 315 sets the voltage of the IC substrate connection to within a transistor threshold voltage of the voltage of the external IC connection when the voltage of the external IC connection is less than zero volts.

When the voltage at VBUS is less than zero volts, the parasitic diode (105 in FIG. 1) between the high voltage tolerant NWell (HVNWell) and the Bulk/Source junction in transistor M3 drives the output (VCLAMP) to below ground. The voltage at VCLAMP tracks the negative voltage of VBUS, and the current through the forward biased parasitic diode 105 is limited by resistor R2. The negative voltage on VCLAMP, when VBUS is less than zero volts, allows the under voltage circuit 315 to establish a negative voltage supply rail.

The under voltage circuit 315 includes an NMOS transistor M7 having a gate region communicatively coupled to electrical ground and a source region communicatively coupled to the substrates by the internal negative voltage supply rail (nrail). As VCLAMP decreases, transistor M7 turns on to connect nrail to the VCLAMP voltage, which is substantially the negative voltage at VBUS.

The negative voltage supply rail is electrically connected to the substrates of the high voltage devices and the gate of PMOS transistor M4. Thus, the substrates of the high voltage devices are set to approximately the voltage at VBUS. Because the substrates of the devices are connected to the now-negative voltage rail, the substrate of M3 is electrically below ground and the parasitic devices of the high voltage devices are reverse biased, and the reverse biasing limits the current at the device junctions.

When VBUS is below ground, transistor M1 and resistor R1 act as a high impedance voltage divider. The divided voltage weakly biases transistor M2 to an "on" state and circuit node N2 becomes a negative voltage. Initially, PMOS transistor M4 shorts the negative voltage of N2 to the gate of NMOS transistor M3, but M4 may lose drive capability (e.g., turns off) once the voltage on nrail settles. The under voltage circuit 315 includes a schottky diode DO connected between a gate of the high voltage transistor M3 and electrical ground. The Schottky diode DO provides additional drive to bias the gate of M3 to a Schottky diode drop below ground, which shorts VBUS to VLCAMP to further stabilize the negative voltage on nrail.

Figure 4A:
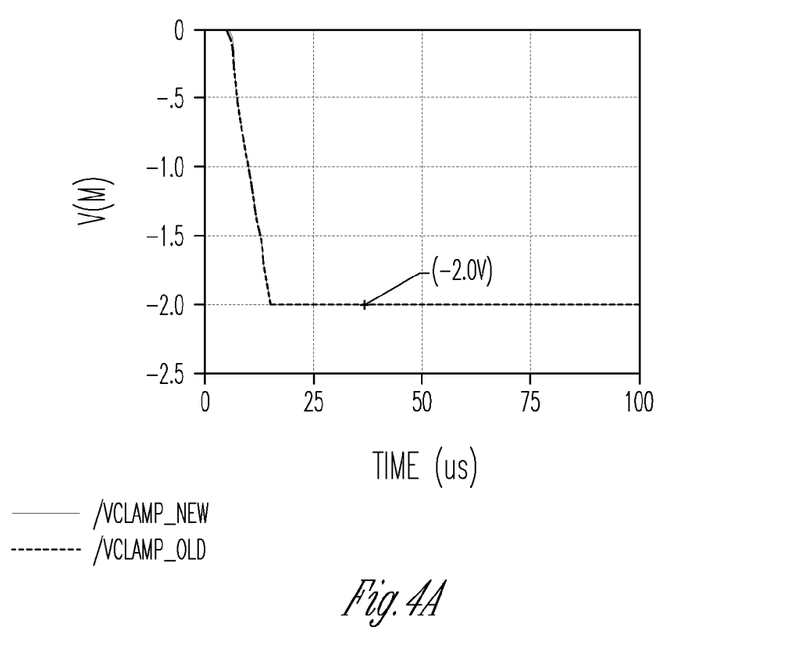
FIGS. 4A and 4B show a simulation of voltage clamp circuits.
Figure 4B:
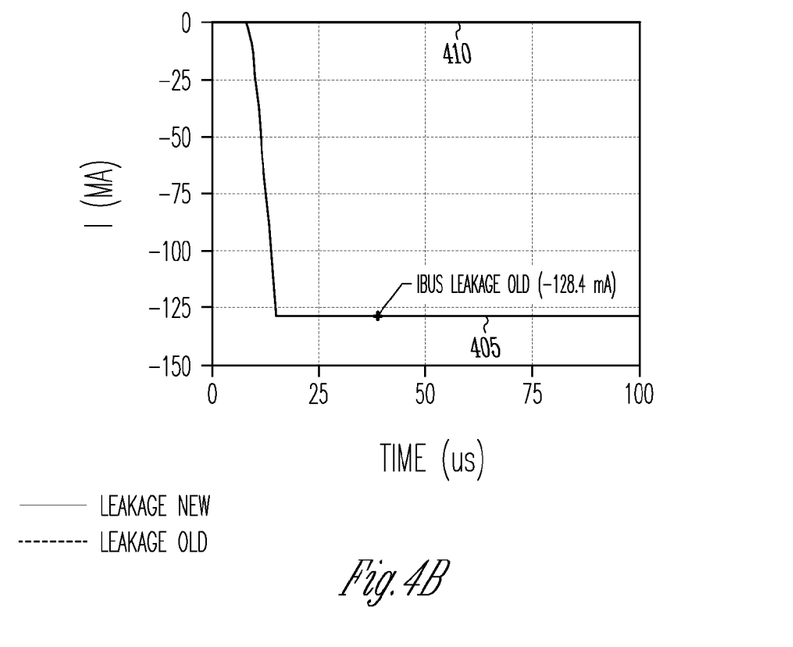

FIGS. 4A and 4B show a simulation of the voltage clamp circuit 310 of FIG. 3 without the under voltage circuit 315 and with the under voltage circuit 315. FIG. 4A shows a VBUS voltage of −2.0V that is applied to both versions of the voltage clamp circuit 310. The simulation of FIG. 4B shows the resulting leakage current. Waveform 405 shows that the leakage current is 128 milliamps (mA) for the case when the clamp circuit alone is biased with an under voltage of −2.0V, while the leakage current for the case of the clamp circuit with an under voltage circuit is only 194 microamps (µA). The FIGS. show that the under voltage circuit is effective at keeping the parasitic diodes of the high voltage devices reversed biased. While there is still a fair amount of current draw with the under voltage circuit when VBUS is below ground, the junctions of the high voltage devices may be able to sustain the reduced current without significant degradation. Thus, the clamp circuit is tolerant of an under voltage event.

Figure 5:
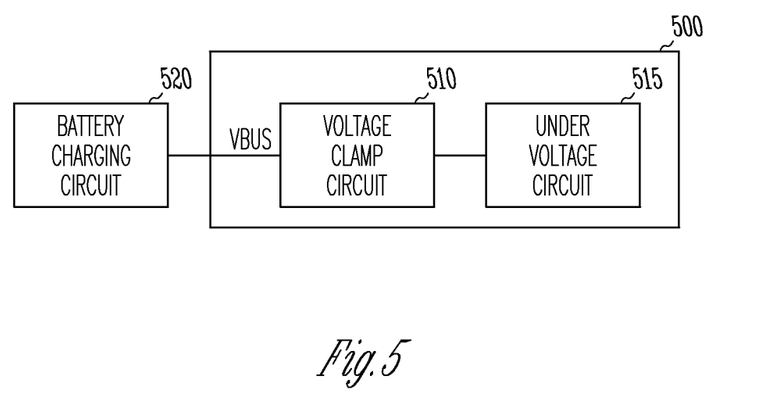
FIG. 5 shows an example of an electronic system comprising an IC and a battery charging circuit.

FIG. 5 shows an example of a system comprising an IC 500 and a battery charging circuit 520. The IC includes an external IC connection (VBUS) and an IC substrate connection (not shown). The IC 500 includes a voltage clamp circuit 510 configured to clamp the voltage supply of circuits internal to the IC to within a normal operating voltage range when the voltage of the external IC connection exceeds the normal operating voltage range, and an under voltage circuit 515 communicatively coupled to the clamp circuit and configured to set the voltage of the substrate to a second voltage when the voltage at the external IC connection of the IC is less than zero volts. The system also includes a battery charging circuit 520 communicatively coupled to the voltage clamp circuit 510. In certain examples the battery charging circuit 520 is included in the IC 500.

In some examples, the system is included in a cellular telephone to charge a cellular telephone battery. The external connection (VBUS) can be communicatively coupled to a universal serial bus (USB) port of the cellular telephone.

According to some examples, the voltage clamp circuit 510 clamps the voltage supply of circuits internal to the IC to within a normal operating voltage range when the voltage of the external IC connection is within a voltage range of six volts (6V) to twenty-eight volts (28V). The under voltage circuit is configured to set the voltage of the substrate connection to substantially the voltage at the external IC connection when the voltage of the external IC connection is in a voltage range of less than zero volts (0V) to negative six volts (−6V).

ADDITIONAL NOTES

Example 1 includes subject matter (such as an apparatus or IC) comprising an external IC connection, an IC substrate connection, wherein the voltage of the IC substrate connection is set to a first voltage when a voltage of the external connection of the IC is within a normal operating voltage range, a voltage clamp circuit configured to clamp the voltage supply of one or more circuits internal to the IC to within a normal operating voltage range when the voltage of the external IC connection exceeds the normal operating voltage range, and an under voltage circuit communicatively coupled to the clamp circuit and configured to set the voltage of the substrate to a second voltage when the voltage at the external IC connection of the IC is less than zero volts.

In Example 2, the subject matter of Example 1 can optionally include an under voltage circuit that can be configured to set the voltage of the substrate to substantially the voltage at the external IC connection when the voltage at the external IC connection is less than zero volts.

In Example 3, the subject matter of one or any combination of Examples 1 and 2 can optionally include an under voltage circuit that can be configured to set the voltage of the IC substrate connection to within a transistor threshold voltage of the voltage of the external IC connection when the voltage of the external IC connection is less than zero volts.

In Example 4, the subject matter of one or any combination of Examples 1-3 can optionally include an under voltage circuit that can have an N-type Metal Oxide Semiconductor (NMOS) transistor having a gate region communicatively coupled to electrical ground and a source region communicatively coupled to the substrate connection, and wherein the IC substrate connection is electrically coupled to substantially the voltage at the external IC connection by the NMOS transistor when the voltage of the external IC connection is less than zero volts.

In Example 5, the subject matter of one or any combination of Examples 1-4 can optionally include an under voltage circuit that can be configured to produce a negative voltage supply rail when the voltage at the external IC connection is less than zero volts, and electrically connect the IC substrate connection to the negative voltage supply rail.

In Example 6, the subject matter of one or any combination of Examples 1-5 can optionally include a voltage clamp circuit that can include one or more high voltage transistors and the under voltage circuit is configured to electrically connect a substrate connection of the high voltage transistors to substantially the voltage at the external IC connection when the voltage at the external IC connection is less than zero volts.

In Example 7, the subject matter of one or any combination of Examples 1-6 can optionally include a high voltage transistor that can be a high voltage NMOS transistor. The under voltage circuit can include a schottky diode connected between a gate of the high voltage transistor and electrical ground to set the gate of the high voltage transistor to a schottky diode voltage below ground when the voltage at the external IC connection is less than zero volts.

Example 8 can include subject matter (such as a system), or can optionally be combined with the subject matter of one or any combination of Examples 1-7 to include subject matter, comprising an IC and a battery charging circuit. The IC includes an external IC connection, an IC substrate connection where the voltage of the IC substrate connection is set to a first voltage when a voltage of an external connection of the IC is within a normal operating voltage range, a voltage clamp circuit configured to clamp the voltage supply of circuits internal to the IC to within a normal operating voltage range when the voltage of the external IC connection exceeds the normal operating voltage range, and an under voltage circuit communicatively coupled to the clamp circuit and configured to set the voltage of the substrate to a second voltage when the voltage at the external IC connection of the IC is less than zero volts. The battery charging circuit is communicatively coupled to the voltage clamp circuit, and can be included in the IC.

In example 9, the subject matter of Example 8 can optionally be included in a cellular telephone.

In Example 10, the subject matter of one or any combination of Examples 8 and 9 can optionally include an external connection that can be communicatively coupled to a universal serial bus (USB) port of the cellular telephone.

In Example 11, the subject matter of one or any combination of Examples 8-10 can optionally include a voltage clamp circuit that can be configured to clamp the voltage supply of circuits internal to the IC to within a normal operating voltage range when the voltage of the external IC connection is within a voltage range of six volts (6V) to twenty-eight volts (28V).

In Example 12, the subject matter of one or any combination of Examples 8-11 can optionally include an under voltage circuit that can be configured to set the voltage of the substrate connection to substantially the voltage at the external IC connection when the voltage of the external IC connection is in a voltage range of less than zero volts (0V) to negative six volts (−6V).

In Example 13, the subject matter of one or any combination of Examples 8-12 can optionally include an under voltage circuit that can be configured to produce a negative voltage supply rail when the voltage at the external IC connection is less than zero volts, and electrically connect the IC substrate connection to the negative voltage supply rail.

In Example 14, the subject matter of one or any combination of Examples 8-13 can optionally include an under voltage circuit that can be configured to adjust the voltage at the substrate connection to track the voltage of the external IC connection when the voltage of the external IC connection is less than zero volts.

Example 15 can include subject matter (such as a method, a means for performing acts, or a machine-readable medium including instructions that, when performed by the machine, cause the machine to perform acts), or can optionally be combined with the subject matter of one or any combination of Examples 1-14 to include subject matter, comprising setting the voltage of a substrate of an IC to a first voltage when a voltage of an external connection of the IC is within a normal operating voltage range, clamping the voltage supply of circuits internal to the IC to within the normal operating voltage range when the voltage of the external IC connection exceeds the normal operating voltage range, and setting the voltage of the substrate to a second voltage when the voltage of the external IC connection is less than zero volts.

In Example 16, the subject matter of Example 15 can optionally include setting the voltage of the substrate to substantially the voltage at the external IC connection when the voltage at the external IC connection is less than zero volts.

In Example 17, the subject matter of one or any combination of Examples 15 and 16 can optionally include setting the voltage of the substrate to within a transistor threshold voltage of the voltage of the external IC connection when the voltage of the external IC connection is less than zero volts.

In Example 18, the subject matter of one or any combination of Examples 15-17 can optionally include setting the voltage of the substrate to a second voltage by producing a negative voltage supply rail when the voltage at the external IC connection is less than zero volts, and electrically connecting the IC substrate connection to the negative voltage supply rail.

In Example 19, the subject matter of one or any combination of Examples 15-18 can optionally include clamping the voltage supply of circuits internal to the IC to within the normal operating voltage range using a high voltage transistor when the voltage of the external IC connection exceeds the normal operating voltage range, and setting a substrate connection of the high voltage transistor to substantially the voltage at the external IC connection.

In Example 20, the subject matter of Example 15 can optionally include means for setting the voltage of a substrate of an IC to a first voltage when a voltage of an external connection of the IC is within a normal operating voltage range, illustrative examples of which can include an IC voltage supply rail, power supply rail, or voltage bus. The subject matter can also include means for clamping the voltage supply of circuits internal to the IC to within the normal operating voltage range when the voltage of the external IC connection exceeds the normal operating voltage range, an illustrative example of which is a voltage clamp circuit, or diode stack. The subject matter can further include means for setting the voltage of the substrate to a second voltage when the voltage of the external IC connection is less than zero volts, such as an under voltage circuit, a negative voltage supply rail, or negative voltage bus.

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile computer-readable media during execution or at other times. These computer-readable media can include, but are not limited to, hard disks, removable magnetic disks, removable optical disks (e.g., compact disks and digital video disks), magnetic cassettes, memory cards or sticks, random access memories (RAM's), read only memories (ROM's), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An integrated circuit (IC) to provide both over voltage protection and under voltage protection, the IC comprising:
   an external IC connection;
   an IC substrate connection, wherein a voltage of the IC substrate connection is set to a first voltage when a voltage of the external connection of the IC is within a normal operating voltage range;
   a voltage clamp circuit configured to clamp the voltage supply of one or more circuits internal to the IC to within a normal operating voltage range when the voltage of the external IC connection exceeds the normal operating voltage range; and
   an under voltage circuit communicatively coupled to the clamp circuit and configured to set the voltage of the substrate to a second voltage when the voltage at the external IC connection of the IC is less than zero volts.

2. The IC of claim 1, wherein the under voltage circuit is configured to set the voltage of the substrate to substantially the voltage at the external IC connection when the voltage at the external IC connection is less than zero volts.

3. The IC of claim 2, wherein the under voltage circuit is configured to set the voltage of the IC substrate connection to within a transistor threshold voltage of the voltage of the external IC connection when the voltage of the external IC connection is less than zero volts.

4. The IC of claim 2, wherein the under voltage circuit includes an N-type Metal Oxide Semiconductor (NMOS) transistor having a gate region communicatively coupled to electrical ground and a source region communicatively coupled to the substrate connection, and wherein the IC substrate connection is electrically coupled to the voltage at the external IC connection by the NMOS transistor when the voltage of the external IC connection is less than zero volts.

5. The IC of claim 2, wherein the under voltage circuit is configured to:
   produce a negative voltage supply rail when the voltage at the external IC connection is less than zero volts; and
   electrically connect the IC substrate connection to the negative voltage supply rail.

6. The IC of claim 1, wherein the voltage clamp circuit includes one or more high voltage transistors and the under voltage circuit is configured to electrically connect a substrate connection of the high voltage transistors to the voltage at the external IC connection when the voltage at the external IC connection is less than zero volts.

7. The IC of claim 6, wherein the high voltage transistor includes a high voltage NMOS transistor, wherein the under voltage circuit includes a schottky diode connected between a gate of the high voltage transistor and electrical ground to set the gate of the high voltage transistor to a schottky diode voltage below ground when the voltage at the external IC connection is less than zero volts.

8. A system comprising:
   an integrated circuit (IC) to provide both over voltage protection and under voltage protection, the IC including:
      an external IC connection;
      an IC substrate connection, wherein a voltage of the IC substrate connection is set to a first voltage when a voltage of an external connection of the IC is within a normal operating voltage range;
      a voltage clamp circuit configured to clamp the voltage supply of circuits internal to the IC to within a normal operating voltage range when the voltage of the external IC connection exceeds the normal operating voltage range; and
      an under voltage circuit communicatively coupled to the clamp circuit and configured to set the voltage of the substrate to a second voltage when the voltage at the external IC connection of the IC is less than zero volts; and
   a battery charging circuit communicatively coupled to the voltage clamp circuit.

9. The system of claim 8, wherein the system is included in a cellular telephone.

10. The system of claim 9, wherein the external connection is communicatively coupled to a universal serial bus (USB) port of the cellular telephone.

11. The system of claim 9, wherein the voltage clamp circuit is configured to clamp the voltage supply of circuits internal to the IC to within a normal operating voltage range when the voltage of the external IC connection is within a voltage range of six volts (6V) to twenty-eight volts (28V).

12. The system of claim 8, wherein the under voltage circuit is configured to set the voltage of the substrate connection to substantially the voltage at the external IC connection when the voltage of the external IC connection is in a voltage range of less than zero volts (0V) to negative six volts (−6V).

13. The system of claim 8, wherein the under voltage circuit is configured to:
   produce a negative voltage supply rail when the voltage at the external IC connection is less than zero volts; and
   electrically connect the IC substrate connection to the negative voltage supply rail.

14. The system of claim 8, wherein the under voltage circuit is configured to adjust the voltage at the substrate connection to track the voltage of the external IC connection when the voltage of the external IC connection is less than zero volts.

15. A method of operating an integrated circuit (IC), the method comprising:
   setting the voltage of a substrate of the IC to a first voltage when a voltage of an external connection of the IC is within a normal operating voltage range;
   clamping the voltage supply of circuits internal to the IC to within the normal operating voltage range when the voltage of the external IC connection exceeds the normal operating voltage range; and
   setting the voltage of the substrate to a second voltage when the voltage of the external IC connection is less than zero volts.

16. The method of claim 15, wherein setting the voltage of the substrate to a second voltage includes setting the voltage of the substrate to the voltage at the external IC connection when the voltage at the external IC connection is less than zero volts.

17. The method of claim 16, wherein setting the voltage of the substrate to a second voltage includes setting the voltage of the substrate to within a transistor threshold voltage of the voltage of the external IC connection when the voltage of the external IC connection is less than zero volts.

18. The method of claim 15, wherein setting the voltage of the substrate to a second voltage includes:
   producing a negative voltage supply rail when the voltage at the external IC connection is less than zero volts; and
   electrically connecting the IC substrate connection to the negative voltage supply rail.

19. The method of claim 15,
   wherein clamping the voltage includes clamping the voltage supply of circuits internal to the IC to within the normal operating voltage range using a high voltage transistor when the voltage of the external IC connection exceeds the normal operating voltage range; and
   wherein setting the voltage of the substrate to a second voltage includes setting a substrate connection of the high voltage transistor to the voltage at the external IC connection.

20. An apparatus comprising:
   means for setting the voltage of a substrate of an IC to a first voltage when a voltage of an external connection of the IC is within a normal operating voltage range;
   circuit means for clamping the voltage supply of circuits internal to the IC to within the normal operating voltage range when the voltage of the external IC connection exceeds the normal operating voltage range and for setting the voltage of the substrate to a second voltage when the voltage of the external IC connection is less than zero volts.

* * * * *